United States Patent [19]

Marks

[11] 4,445,050

[45] Apr. 24, 1984

[54] DEVICE FOR CONVERSION OF LIGHT POWER TO ELECTRIC POWER

[76] Inventor: Alvin M. Marks, Bigelow Rd., Athol, Mass. 01331

[21] Appl. No.: 330,791

[22] Filed: Dec. 15, 1981

[51] Int. Cl.³ .......................................... H02M 7/02
[52] U.S. Cl. .................................. 307/145; 136/244; 307/151
[58] Field of Search ............... 307/151, 145; 136/256, 136/244

[56] References Cited

U.S. PATENT DOCUMENTS

| | | | |
|---|---|---|---|
| 3,310,439 | 3/1967 | Seney | 136/256 |
| 3,475,609 | 7/1966 | Schneider | 136/256 |
| 4,251,679 | 2/1981 | Zwan | 136/244 |
| 4,360,741 | 11/1982 | Fitzsimmons et al. | 307/151 |

*Primary Examiner*—L. T. Hix
*Assistant Examiner*—Todd E. DeBoer

[57] ABSTRACT

This invention relates to a high efficiency device for the direct conversion of light power to electrical power. Present photocells for accomplishing this purpose are well known to the art and have a theoretical efficiency not exceeding about 20%. In practice, realization of efficiency of about 10% has been achieved, but ultimately the theoretical limitation is an upper limit which cannot be exceeded by devices utilizing known construction. The present device differs from the prior art devices in that it utilizes a plurality of dipole antennae for absorbing light photons, employing an alternating electrical field of said photons to cause electrons in the dipole antenna to resonate therewith and absorb electrical power therefrom, with means for rectifying said AC power to DC, said DC being accumulated on conducting busbars from the plurality of antennae and associated rectifying circuits.

12 Claims, 3 Drawing Figures

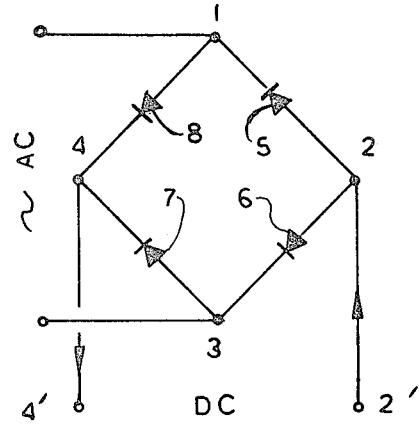
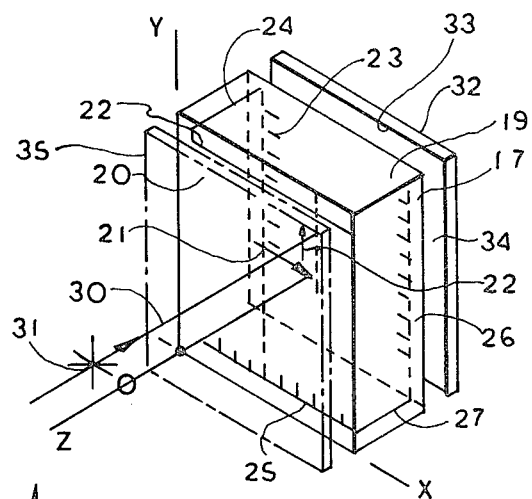
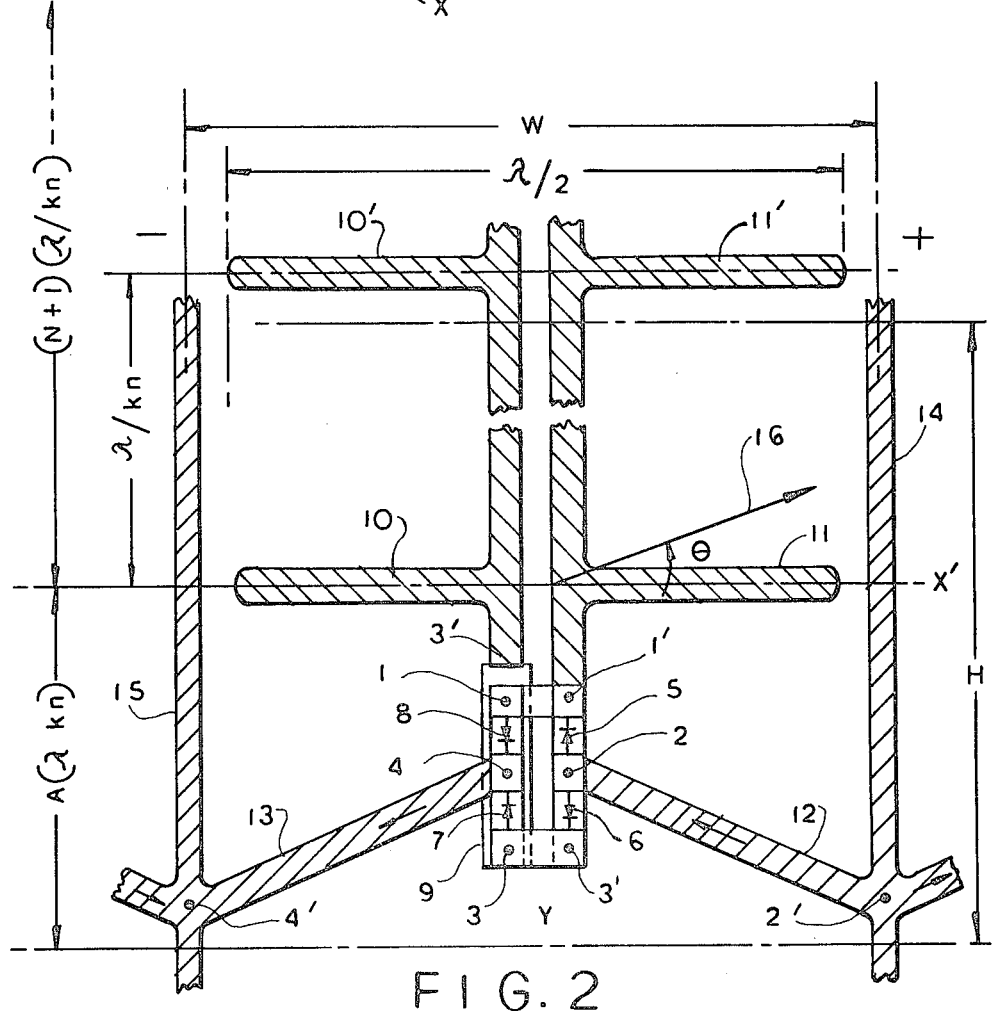

DEVICE FOR CONVERSION OF LIGHT POWER TO ELECTRIC POWER

BACKGROUND

Present efforts in the conversion of light power directly to electric power employ "photo voltaic" devices. Various types of photo voltaic devices have been proposed. Amongst these are photo voltaic cells which comprise layers of conductors, insulators and semi-conductors. The best ones are made from single crystal silicon appropriately "doped" with small quantities of other elements. These have a theoretical efficiency not exceeding about 20% and actual values of 8 to 10% have been realized.

The green leaves in every plant or algae cell contain structures[1] for converting photon energy to chemical energy comprising carbon, hydrogen, oxygen, and small amounts of other elements such as magnesium.

These structures have become well known. Electron microscope pictures depict structures whose function is to absorb the energy of a light photon which is electromagnetic, and to utilize this energy to break up a water molecule and to free an electron and protonic hydrogen. Four photons must be absorbed by the molecular structure. An electron is transported by each absorption of a photon to a higher potential. The protonic hydrogen liberated combines with atmospheric carbon dioxide and liberates free oxygen to the atmosphere. The protonic hydrogen and carbon dioxide form starches and other compounds which are the basis for the living process, known as photosynthesis. The conversion of photon energy to chemical energy by the separation of H+ and e− charges occurs in a manner similar to that of a p-n junction in a semi-conductor photovoltaic cell, and which has about the same efficiency. There have been attempts to emulate this process with varying degrees of success in the laboratory. However, the starches produced then have to be burned in some other converter to produce electric power.

Other prior art processes employ the photo electrochemical potential, to directly produce electric power; efficiency: 6 to 7%, theoretical: 20%[2].

DEFINITIONS

Microarray: A set of N dipole antennae connected to a single pair of conductors.

Rectenna: N antennae connected to a pair of conducting leads and to a rectifier to provide a DC output.

A NASA Tech Brief[3] describes a "rectenna"; for example, a 10-cm long dipole reactive to microwaves and a single diode rectifier to convert the micro wave induced AC power to DC power. This system converts about 82% of the beamed microwave power directly to DC electric power. A space platform is proposed to gather sun power, convert it to microwave power and beam it to earth from a stable orbit. This microwave power will then be directly converted to electric power using a rectenna array over several square kilometers.

In outer space conventional photo voltaic cells are proposed to convert the sun power to electric power to actuate the microwave transmitters which beam the microwave power to earth. Such photo voltaic devices are only about 10% efficient. Using the light/electric power conversion device disclosed herein, the space platform would be 8 times smaller in area for the same power, and less expensive.

This invention uses a new, novel and different approach based on the direct conversion of photon energy to DC electric energy employing microarrays of submicron antennae connected to a submicron rectifier.

The microarray comprises a submicron rectenna array in which each antenna element has a length of 1800 Å and a width of about 100 Å. These elements are split in the center and the output directly rectified using a semi-conductive material as a diode rectifier. The submicron rectenna array described hereinafter reacts with light waves instead of microwaves. Light has a wavelength from about 0.35 to 0.8 $\mu$m, from the near ultraviolet through the visible spectrum to the near infrared.

The device of the present invention will produce electric power at an efficiency of about 75%, an improvement by a factor of 8 over existing systems. The device of the present invention is less expensive than present photovaltaic devices since large single expensive crystals of silicon are not used. We propose to substitute a miniaturized metal structure deposited on an insulating substrate, which is within the State of the Art on submicron structures[4].

FIGURES

In the figures,

FIG. 1 shows a conventional AC-DC rectifier device having 4 diodes.

FIG. 2 shows a light/electric power converter using a dipolar array and rectifier according to the present invention.

FIG. 3 shows a perspective view of a light/electric power converter comprising two dipolar arrays, each at right angles to the other, on opposite faces of a transparent insulating plate.

FIG. 1 shows a conventional rectifying circuit commonly employed in electrical technology. Rectifiers 5, 6, 7, and 8 enable the conversion of the AC to DC. The AC power is applied to terminals 1 and 3 and the DC power is taken from terminals 2 and 4.

Referring to FIG. 2, the diode elements, connected as shown in FIG. 1, are again identified with the same numbers, now rearranged in a straight line configuration but having the same electrical connections. The configuration shown in FIG. 2 is made possible by the use of an insulating barrier 9 shown as a dashed rectangular area. This enables point 3 to be connected to point 3′ by passing over the point 4 and the rectifiers 7 and 8 without being in electrical contact therewith. The dipole elements 10 and 11 are shown as an array of linear dipoles; 10′ and 11′; etc.

Although only two dipoles are shown in FIG. 2, it will be understood many such dipoles may be employed, for example, 25. The criterion is that only 1 photon should impinge on the array, spaced in time from the next photon to enable the conversion of its electromagnetic wave to DC, without interference from the simultaneous incidence of a second photon. The dipole elements 10 and 11 absorb photon energy, resolving it in the direction of the dipole. The electric vector of polarization of the input photo wave 16 is shown at an angle $\theta$ to the horizontal axis X X′ on the drawing.

By the "resolved component" of the electromagnetic energy of the photon, it is now understood according to the quantum theory, that the photon energy is either entirely absorbed or entirely transmitted, the proportion of photon energy absorbed or transmitted being the same as computed using classical theory for the resolved electric vector. The dipole antenna is about $\lambda/2n \approx 2000$ Å in length. The diagram FIG. 2 is drawn to scale at a magnification of 500,000 at a scale: 1 cm=200 Å. Such a small dimension can be obtained using electron or ion beams as presently used in the smallest semiconducting elements[4]. The rectifier elements 5, 6, 7, and 8 comprise semi-conductors which are amorphous, crystalline or epitaxial[5], each about 100 to 200 Å in diameter. These semi-conductor areas are suitably doped to obtain a p/n junction to provide the uni-directional flow of electrons. Leads 12 and 13 connect points 2 and 2' and 3 and 4' respectively, providing DC power to the busbars 14 and 15; n=index of refraction of coating 17. Adjacent elements may be repeated along the X axis and along the Y axis. The dipoles in the array repeat at $\lambda/k$ (or $\lambda/kn$) intervals and are connected together as shown. It is preferred that in elements repeating along the X axis, the direction of the rectifiers is reversed, whereby there is a common positive busbar 14 and a common negative busbar 15. Each array is contained within a rectangular space; for example, of height $(N+1)(\lambda/kn) + A(\lambda/kn)$ and width about 2200 Å, where N=number of dipole antennae in a microarray and where A $(\lambda/kn)$ is the space between it and the next microarray. These dimensions may vary somewhat in accordance with the wavelength of light employed. Generally, light from the middle of the spectrum (green) will require that the length of the dipole be $\lambda/2n = 5600/2 \times 1.5 = 1867$ Å (instead of 2000 Å). Other dimensions are decreased in the same proportion. The value $2 \leq k < 8$.

Without a transparent insulating coating over the dipole structure, the dimensions are increased 50% to $\lambda/2 = 5600$ Å/2 = 2800 Å (instead of 1800 Å). The line width is then 300 Å instead of 200 Å. This will facilitate fabrication but increase its fragility.

This device may be fabricated upon a transparent slab by the deposition of one or more metal coatings in a known manner. The various rectifier elements are first prepared by opening appropriate windows in the metal coating utilizing an electron beam and suitably coating and doping the rectifying areas. An electron or ion beam cuts the shape and connections shown. The connections are completed after deposition of the insulating coating 9. The circuit is then the same as that shown in FIG. 1.

The common positive busbars 14 from alternate groups of antennae are all connected at one end of the array of dipoles. Similarly, the common negative busbars 15 are all connected at the other end of the device. In this manner all of the positive terminals are brought out on one side and all of the negative terminals are brought out on the other side of the device.

An array of dipole elements in a 2-dimensional area convert light power directly to electrical power from photons of visible light emitted by the sun impinging on the area.

This device has a theoretical efficiency of about 80%; thus avoiding the problems encountered by the conventional methods of the prior art.

FIG. 3 shows a device which enables the utilization of the randomly oriented polarization of the incident photons. The device shown in FIG. 3 comprises a transparent insulating sheet supporting member 19 such as polished glass. Mounted on the faces thereof are dipole arrays and rectifying elements such as shown in FIG. 2 and described hereinabove.

The dipoles on the front face 20 of the sheet 19 are oriented with their long axis horizontal and parallel to the X axis, as shown by the arrow 21; and the dipoles on the rear face 23 of the sheet 20 are oriented vertically and parallel to the Y axis as shown by the arrow 22. Incident light 30, with its electromagnetic waves oriented at random, as shown by the symbol 31*, are then resolved, absorbed, and converted by the dipoles on both faces of the sheet.

Photons are not only random in polarization direction, but fluctuate in time. However, the oscillations of the electric field from a single photon are coherent within a small time interval so that the result is a rectification of the photon AC electric field to DC.

A methematical physics analysis of the random polarization and random impact of light photons has determined that there will be no net cancellation of the light/electric conversion due to the great number of photons having random wave phases impinging simultaneously on the device.

The rectifier elements shown herein may utilize relatively expensive silicon crystal slabs experimentally employed for computer chips. However, it is preferred to prepare amorphous or epitaxial rectifying elements by epitaxial growth and ion implantation upon a glass surface.

An insulating coating may be placed over the first layer dipole-rectifier device shown in FIG. 2, and over this an identical device may be placed in a second layer offset with respect to the first layer device, so as to absorb incident photons which may pass unabsorbed between the spaced antennae microarrays in the first layer. This same two-layer structure may be placed on the opposite face of the transparent sheet 23 but at right angles, thus absorbing substantially all the incident photon-power and converting it to electric power with an efficiency of about 80%, based on measurements with the microwave analogue.

In another embodiment of this invention, in lieu of the multiple layers of dipoles to more fully absorb and convert the incident radiation to electricity, a sheet 32 having a reflecting surface 33 may be placed behind the sheet 19 so as to reflect back that portion of the radiation which is transmitted through the sheet. The sheet 32 optionally may be held in proximity or may be laminated to the sheet 19 by a transparent adhesive layer 34. The reflector 33 may be specular or may scatter the light.

The dipole antennae microarray on the front face 20 may be coated with a protective transparent coating 17, or may be laminated or fused to a front protective sheet 35, which results in a durable composite structure.

Solar energy is distributed over wavelengths $\lambda$ from the near ultraviolet at about 3800 Å through the visible spectrum from 4000 Å to 7000 Å to the near infrared at 8500 Å; along a "black body" curve with an energy peak in the blue-green region.

Consequently, the antennae must be broad band or of a variety of lengths to respond to this range of wavelengths. The antenna dipole is broad banded by increasing its width to length ratio; for example, to 5. Alternately, or in combination with a broad banded antenna, adjacent dipoles may have a variety of lengths, and be spaced closely from each other; the lengths varying for a medium of n=1.5 from 3800/3=1267 Å to 8500/3=2833 Å.

The effective cross section of an antenna is about $(\lambda^2/8n^2) = (\lambda/2n)(\lambda/4n)$. Hence, a spacing of $(\lambda/4n)$ between antennae (k=4) is sufficient to absorb all photons whose electric vectors are resolved in the direction of the antenna length. However, in an antennae array other design factors must be considered, such as directivity, gain, etc., as is well known in the art[6,7].

TABLE OF SYMBOLS $c$ = Velocity of light $2.9979 \times 10^8$ m/s
$h$ = Plancks Constant = $6.626 \times 10^{-34}$ J.s.
$n$ = Index of refraction
$p$ = Light power watts/m$^2$
$k$ = Numerical constant which determines the distance between dipoles in the microarray. It is usually chosen=2; but may be a design value between 2 and 8
$B_a = B_1 B_2$ = Packing factor
$B_1$ = Packing factor along X axis
$B_2$ = Packing factor along Y axis
$E$ = Energy of photon, Joules
$N$ = Number of dipoles on a microarray; for example 1 to 25
$\lambda$ = Wavelength of photon m
$\nu$ = Frequency of photon cycles/s.

MATHEMATICAL PHYSICS ANALYSIS

Data on Photometric Units

1. Photon Frequency, Wavelength and Energy

| | | |
|---|---|---|
| 1.1 | 5320 Å → 5.6 × 10$^{14}$ | Hz (cycles/sec) frequency |
| 1.2 | $\lambda\nu = c$ | wavelength |
| 1.3 | $E = n\nu$ Joules | energy |
| 1.4 | Normal levels of room illumination 10 ft lamberts (reflection) | |
| 1.5 | | ~10$^{14}$ photons/cm$^2$-sec. |
| 1.6 | Daylight 10$^2$ ft lamberts | ~10$^{15}$ photons/cm$^2$-sec. |

2. At 0.555 μm→5555 Å; $5.37 \times 10^{14}$ Hz there are:

$2.8 \times 10^{12}$ photons/s ≈ 1 μW = 680 μlumens $2.8 \times 10^{18}$ photons/s ≈ 1 watt.

3. For daylight from (1.5) and (2.1)

$p$ = Light power/cm$^2$ = $10^{15}/2.8 \times 10^{12} = 0.357 \times 10^3$ μW/cm$^2$ (photons/cm$^2$−sec)/(photons/sec μW) = $3.57 \times 10^{-4}$ W/cm$^2$ $p = 3.57$ W/m$^2$ (by reflection).

4.

| | | | |
|---|---|---|---|
| 4.1 | Solar Constant | = | 2 gm cal/min-cm$^2$ |
| | | = | (1/30) gm cal/sec-cm$^2$ |
| 4.2 | Cal/gm-sec | = | 4.183 Watts |
| 4.3 | Hence, Solar constant outside the atmosphere | | |
| | (1/30) × 4.184 = 0.1395 W/cm$^2$ | | |
| | = 1395 W/m$^2$ | | |

System Analysis

1. Photon Impact Rate

Assuming direct sunlight at 25% of the solar constant; the available solar power is:

$0.25 \times 1395 \approx 350$ W/m$^2$

From 2:

$350 \times 2.8 \times 10^{18} \approx 1.0 \times 10^{<}$ photons/m$^2$−sec.

For each element embedded in a material having an index of refraction of 1.5 length of dipole is:

| | | |
|---|---|---|
| $\lambda/2n$ | = | $\lambda/3 = 5555/3 = 1850$ Å |
| | = | $1850 \times 10^{-10}$ m |

Assuming 1 element per 2000 Å × 2000 Å area = $(2000 \times 10^{-10})^2 = 4 \times 10^{14}$ elements/m$^2$.

Photons/sec-element = $10^{21}/4 \times 10^{14} = 2.5 \times 10^6$ photons/s per dipole.

Each ¼ μs ($0.25 \times 10^{-6}$ sec) a photon will impinge on a dipole antenna. Since each photon at 5555 Å has a frequency of $0.54 \times 10^{14}$ Hz (cycles/s) in each ¼ μs interval there can be $0.54 \times 10^{14} \times 0.25 \times 10^{-6} \approx 14 \times 10^6$ discrete cycles.

This is adequate to individually actuate each rectifier unit and produce a DC output without cancellation due to simultaneous random impingement of too many photons.

2. Conversion Efficiency

The dipolar microarrays require a packing factor along the X axis of:

$B_1 = (\lambda/2n)/[(\lambda/2n) + (\lambda/4n)] = 0.75$ and a packing factor along the Y axis of:

$B_2 = N(\lambda/kn)/[N(\lambda/kn) + A(\lambda/kn)]$ if $N = 25$; and $A = 2$, then:

$B_2 = 25/27 = 0.925$.

The $B_a$ packing factor for this rectenna array is:

$B_a = B_1 B_2 = 0.75 \times 0.925 = 0.693$.

The composite plate array in FIG. 3 then acts like a filter having a % transmission = $100 - 69.3 = 31.7\%$. Two such plates have a % transmission = $100(0.317)^2 = 10\%$ of the incident light; and, if the DC electric conversion efficiency = 82%, the % efficiency of the composite = $100 (0.75 \times 0.90) = 67.5\%$.

3. Results of Calculations 3.1. The impinging photons will be so well spaced in time that they will not overlap and their phases will not cancel each other. Each photon will be separately absorbed, and its energy converted to DC electric current pulse. The many photons will produce a steady DC electric power.

3.2 The output power of each dipole antenna is:

$(350/4 \times 10^{14}) = 0.875 \times 10^{-12}$ Watts/dipole 3.3 Since the overall conversion efficiency of light/electric power of a 2-side composite with reflector is about 67%, the output electric DC power will be about $350 \times 0.67 \approx 235$ W/m$^2$.

It will be understood that various modifications of the antennae structures[6,7], described herein may be made, such modifications being within the State of the Art and included within the scope of this invention.

REFERENCES

1. "The Photosynthetic Membrane", Kenneth R. Miller, *Scientific American*, October 1979, pp 102-113, Bibliography, p 186.

2. Nozik, A. J., Solar Energy Research Institute, Faraday Discussion No. 70, Sept. 8–10, 1980, Oxford University, England.
3. *NASA Tech Brief,* Winter 1978, Vol. 3, Number 4 "Efficient Rectifying Antenna", pp 497-8.
4. *Science,* Vol. 214, Nov. 13, 81, "Cornell Submicron Facility Dedictated".
5. Proceedings of the Ninth International Conference on Amorphous and Liquid Semiconductors, Grenoble, France, 7/81, to appear in *Le Journal de Physique.*
6. *Antennas,* John D. Kraus, McGraw-Hill Book Co., Inc., 1950, New York.
7. *Antenna Engineering Handbook,* Henry Jasik, Editor, McGraw-Hill Book Company, Inc., 1961, New York.

Having thus fully described my invention, what I wish to claim as new is:

1. In a light/electric energy converter an insulating sheet, a dipole antenna on said sheet to intercept light photons and convert the resolved electric vector of the alternating electromagnetic energy of said photons to an alternating current in said dipole antenna, a first pair of conducting leads connected to the center of said dipole antenna, an alternating current to a direct current rectifier connected to said leads, a second pair of leads from said rectifier, a pair of output terminals connected to a load, said second pair of leads being connected to said terminals to provide DC power to the said load.

2. In a light/electric energy converter according to claim 1, an antennae microarray comprising a plurality of said dipole antennae which are spaced $\lambda/kn$ apart and connected to said first pair of conductors, $\lambda$ being the wavelength and n the index of refraction of the medium in which said dipole is located, and k a number from 2 to 8.

3. In a light/electric energy converter according to claim 1, said rectifier comprising a full wave rectifier having 4 diodes.

4. In a light/electric energy converter according to claim 1, and rectifier comprising a full wave rectifier having 4 diodes, in which each of said diodes comprises a p/n junction on a crystalline semiconductor surface.

5. In a light/electric energy converter according to claim 1, said rectifier comprising a full wave rectifier having 4 diodes, in which each of said diodes comprises a p/n junction in an epitaxial differentially doped semiconductor area.

6. In a light/electric energy converter according to claim 1, said rectifier comprising a full wave rectifier having 4 diodes, in which each of said diodes comprises a p/n junction in an amorphous, differentially doped semiconductor area.

7. In a light/electric energy converter according to claim 2, said dipole antennae microarrays being arranged with their axes at right angles to each other on opposite faces of said insulating sheet which is transparent to said light photons, whereby electric vectors of said light photons are absorbed along both axes.

8. In a light/electric energy converter according to claim 2, said dipole antennae microarrays being arranged with their axes at right angles to each other on opposite faces of said insulating sheet which is transparent to said light photons, whereby electric vectors of said light photons are absorbed along both axes, in which at least two layers are coated on each face of said transparent insulating sheets said layers having a transparent insulating spacer between them; whereby substantially all of the incident light-power is converted to electric power.

9. In a light/electric energy converter according to claim 2, said dipole antennae microarrays being arranged with their axes at right angles to each other on opposite faces of said insulating sheet which is transparent to said light photons, whereby electric vectors of said light photons are absorbed along both axes, a reflecting layer on a sheet located behind said insulating sheet, whereby light not absorbed in said light converter is transmitted to said reflecting sheet, and returned to said light converter, whereby a substantial proportion of said light energy is absorbed and converted to electric energy.

10. In a light/electric energy converter according to claim 1, a transparent protective sheet, said protective sheet being laminated onto the front surface of said insulating sheet and over the dipole antennae microarrays thereon, which results in a durable composite.

11. In a light/electric energy converter according to claim 2, in which said dipole antennae are broad banded to respond to a range of light wavelengths.

12. In a light/electric energy converter according to claim 2, in which said plurality of dipole antennae are closely spaced and vary in length from 1267 Å to 2833 Å.

* * * * *